United States Patent
Liang et al.

(10) Patent No.: US 8,552,739 B2
(45) Date of Patent: Oct. 8, 2013

(54) ELECTRONIC DEVICE AND METHOD FOR CORRECTING TIME-DOMAIN REFLECTOMETERS

(75) Inventors: Hsien-Chuan Liang, Tu-Cheng (TW); Shen-Chun Li, Tu-Cheng (TW); Shou-Kuo Hsu, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 442 days.

(21) Appl. No.: 13/040,281

(22) Filed: Mar. 4, 2011

(65) Prior Publication Data

US 2011/0246112 A1 Oct. 6, 2011

(30) Foreign Application Priority Data

Mar. 31, 2010 (TW) .................................. 99110018

(51) Int. Cl.
*G01R 35/00* (2006.01)
(52) U.S. Cl.
USPC ............... 324/601; 324/74; 324/75; 324/130; 324/532; 324/533; 324/534; 324/637; 324/638; 324/642; 324/643; 324/644; 324/645; 324/750.02; 702/85; 702/86; 702/87; 702/88; 702/89; 702/90; 702/91; 702/92; 702/93; 702/94; 702/95; 702/96; 702/97; 702/98; 702/99; 702/100; 702/101; 702/102; 702/103; 702/104; 702/105; 702/106; 702/107
(58) Field of Classification Search
USPC ............. 324/601, 74, 75, 130, 532, 533, 534, 324/637, 638, 642, 643, 644, 645, 750.02; 702/85–107
See application file for complete search history.

(56) References Cited

U.S. PATENT DOCUMENTS

| 3,789,296 | A | * | 1/1974 | Caruso et al. | 324/643 |
| 5,726,578 | A | * | 3/1998 | Hook | 324/643 |
| 2004/0017208 | A1 | * | 1/2004 | Bohley | 324/637 |

OTHER PUBLICATIONS

Mayevskiy E. Differential Deskew Procedure, Tektronix, Inc. Aug. 1, 2013, pp. 1-3, www.tek.com/sites/tek.com/.../DifDeskewProcedureOneModule.docCached.*

* cited by examiner

*Primary Examiner* — Arleen M Vazquez
*Assistant Examiner* — Giovanni Astacio-Oquendo
(74) *Attorney, Agent, or Firm* — Altis & Wispro Law Group, Inc.

(57) ABSTRACT

In an electronic device and a method of correcting time-domain reflectometers, two channels of a time-domain reflectometer are connected to a corrector using cables, and the two channels are enabled to transmit pulses. Parameters Step Deskew and Channel Deskew of the two channels are zeroed. Resistance values of the two channels are measured simultaneously, and the value of the parameter Step Deskew of one of the two channels is adjusted according to the Resistance values of the two channels. Times of achieving the same resistance value of the two channels are measured after the cables and the connector have been disconnected, and the value of the parameter Channel Deskew of one of the two channels is adjusted according to the times of achieving the same resistance value. The adjusted values of the parameters Step Deskew and Channel Deskew are displayed through a display unit.

16 Claims, 3 Drawing Sheets

ELECTRONIC DEVICE AND METHOD FOR CORRECTING TIME-DOMAIN REFLECTOMETERS

BACKGROUND

1. Technical Field

Exemplary embodiments of the present disclosure generally relate to instrument correction, and more particularly to an electronic device and a method for correcting time-domain reflectometers.

2. Description of Related Art

A time-domain reflectometer (TDR) is an electronic instrument for characterizing and locating faults in metallic cables (for example, twisted wire pairs, coaxial cables). The TDR can also locate discontinuities in a connector, a printed circuit board, or any other electrical path.

The TDR transmits a pulse from a source along the metallic cables to a far-end termination. If the metallic cable has a uniform impedance and properly terminated, the entire transmitted pulse will be absorbed in the far-end termination and no signal will be reflected toward the TDR. Any impedance discontinuities, however, can cause some of the incident signal to be sent back towards the source. The result of characterizing and locating faults in the metallic cables may be inaccurate due to errors of the TDR. Therefore, there is room for improvement within the art.

DETAILED DESCRIPTION

The application is illustrated by way of examples and not by way of limitation in the figures of the accompanying drawings in which like references indicate similar elements. It should be noted that references to "an" or "one" exemplary embodiment in this disclosure are not necessarily to only one exemplary embodiment, and such references mean at least one.

In general, the word "module" as used hereinafter, refers to logic embodied in hardware or firmware, or to a collection of software instructions, written in a programming language, such as, for example, Java, C, or Assembly. One or more software instructions in the modules may be embedded in firmware. It will be appreciated that modules may be comprised of connected logic units, such as gates and flip-flops, and may be comprised of programmable units, such as programmable gate arrays or processors. The modules described herein may be implemented as either software and/or hardware modules and may be stored in any type of computer-readable medium or other computer storage device.

Figure 1:
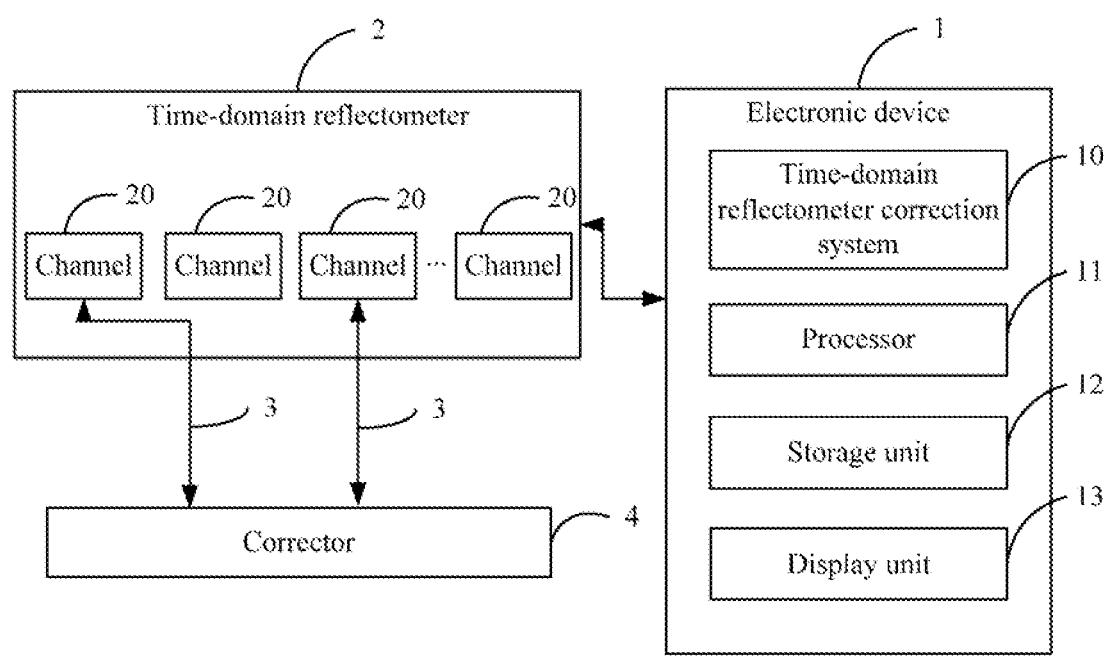
FIG. 1 is a block diagram illustrating an electronic device, according to exemplary embodiments of the present disclosure.

FIG. 1 is a block diagram illustrating an electronic device 1, according to exemplary embodiments of the present disclosure. The electronic device 1 includes components of a time-domain reflectometer (TDR) correction system 10, a processor 11, a storage unit 12, and a display unit 13. These components 1013 communicate over one or more communication buses or signal lines (not shown). The electronic device 1 can be any electronic device, including but not limited to a computer, a server, or a personal digital assistant (PDA), for example. The electronic device 1 may have more or fewer components than shown in FIG. 1, or a different configuration of components. The various components shown in FIG. 1 may be implemented in hardware, software or a combination thereof, including one or more signal processing and/or application specific integrated circuit.

The TDR correction system 10 includes a plurality of function modules (see descriptions referring to FIG. 2), to correct a TDR 2, which is connected to the electronic device 1. The TDR 2 includes a plurality of channels 20. Each channel 20 transmits pulses along their own cables 3 (only two shown). The cables 3 are connected to a corrector 4 for grounding.

The function modules of the TDR correction system 10 may include one or more computerized codes in the form of one or more programs stored in the storage unit 12. The storage unit 12 may include high speed random access memory and may also include non-volatile memory, such as one or more magnetic disk storage devices, flash memory devices, or other non-volatile solid state memory devices. The one or more computerized codes of the TDR correction system 10 include instructions executed by the processor 11, to provide functions for the function modules of the TDR correction system 10.

Figure 2:
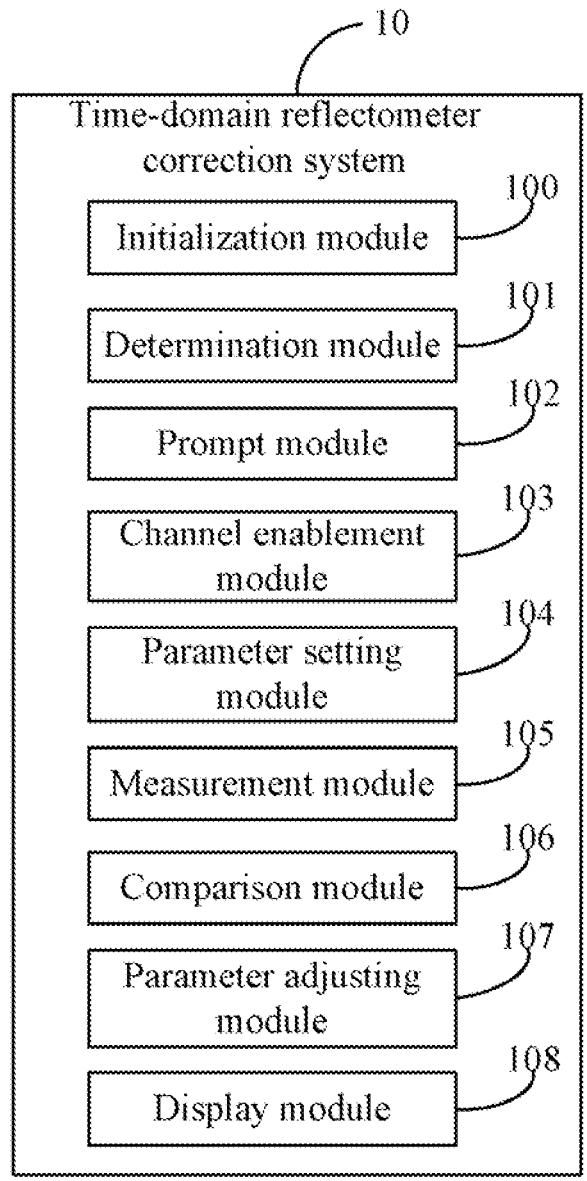
FIG. 2 is a block diagram illustrating function modules of a time-domain reflectometer correction system included in the electronic device of FIG. 1, according to exemplary embodiments of the present disclosure.

FIG. 2 is a block diagram illustrating the function modules of the TDR correction system 10, according to exemplary embodiments of the present disclosure. The function modules of the TDR correction system 10 may include an initialization module 100, a determination module 101, a prompt module 102, a channel enablement module 103, a parameter setting module 104, a measurement module 105, a comparison module 106, a parameter setting module 107, and a display module 108.

The initialization module 100 initializes the TDR 2, to return parameter settings of the TDR 2 to factory values.

The determination module 101 determines if two channels 20 are connected to the corrector 4 by the cables 3.

The prompt module 102 sends a message when less than or more than two channels 20 are connected to the corrector 4 by the cables 3.

The channel enablement module 103 enables the two channels 20 to transmit pulses.

The parameter setting module 104 zeros parameters Step Deskew and Channel Deskew of the two channels 20.

The measurement module 105 measures a first resistance value of one of the two channels 20, and simultaneously, also measures a second resistance value of the other one of the two channels, after the two channels 20 are connected to the connector 4 by the cables 3. The measurement module 105 further measures a first time of achieving a resistance value of one of the two channels 20, measures a second time of achieving the same resistance value of the other one of the two channels 20, after the cables 3 and the corrector 4 are disconnected.

The comparison module 106 compares a difference between the first resistance value and the second resistance value with a first predetermined tolerance, and compares a difference between the first times and the second time with a second predetermined tolerance.

The parameter setting module 107 adjusts the value of the parameter Step Deskew of one of the two channels 20, if the difference between the first resistance value and the second resistance value is beyond the first predetermined tolerance. In one exemplary embodiment, the parameter setting module 107 decreases the value of the parameter Step Deskew of the channel 20 that has a lower resistance value, or increases the value of the parameter Step Deskew of the channel 20 that has a higher resistance value. The parameter setting module 107 further adjusts the values of the parameter Channel Deskew of one of the two channels 20 if the difference between the first time and the second time is beyond the second predetermined tolerance. In one exemplary embodiment, the parameter setting module 107 decreases the value of the parameter Channel Deskew of the channel 20 that needs more time to achieve the resistance value, or increases the value of the parameter Channel Deskew of the channel 20 that needs less time to achieve the resistance value.

The display module 108 displays the adjusted values of the parameters Step Deskew and Channel Deskew of all the channels 20 through the display unit 13, after all the channels 20 have been corrected.

Figure 3:
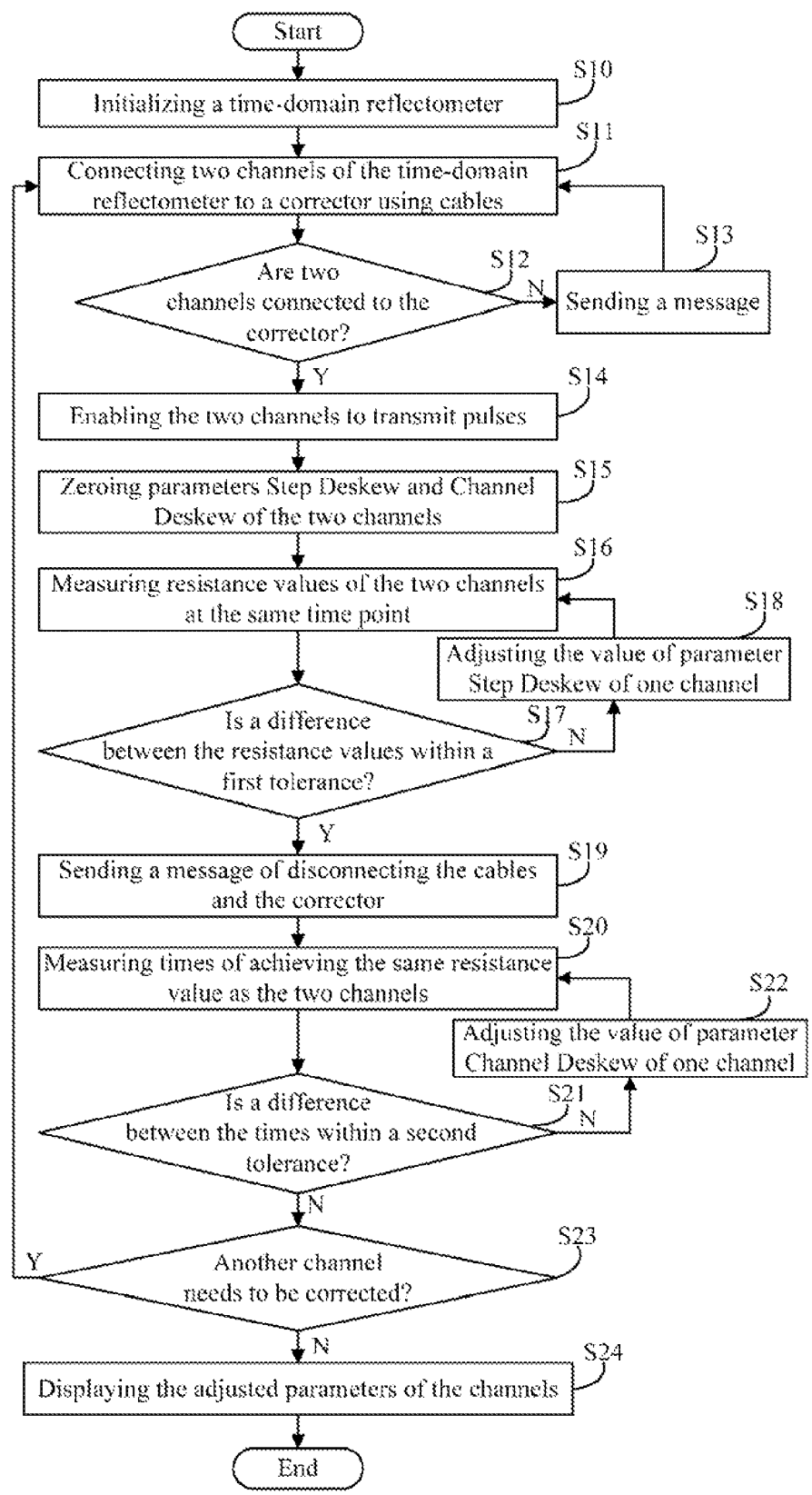
FIG. 3 is a flowchart illustrating a method for correcting time-domain reflectometers, according to exemplary embodiments of the present disclosure.

FIG. 3 is a flowchart illustrating a method of correcting TDRs, according to exemplary embodiments of the present disclosure, implemented by execution of computer readable program code by the processor 11 of the electronic device 1. Depending on the exemplary embodiment, additional blocks in the flow of FIG. 3 may be added, others removed, and the ordering of the blocks may be changed.

In block S10, the initialization module 100 initializes the TDR 2, to return parameter settings of the TDR 2 to factory values.

In block S11, two channels 20 of the TDR 2 are connected to the corrector 4 using their respective cables 3 to ground the two channels 20.

In block S12, the determination module 101 determines whether two channels 20 of the TDR 2 are connected to the corrector 4 by the cables 3. Block S13 is implemented if the number is not two. Block S14 is implemented if the number is two.

In block S13, the prompt module 102 sends a message containing notification that the number is not two.

In block S14, the channel enablement module 103 enables the two channels 20 to transmit pulses.

In block S15, the parameter setting module 104 zeros parameters Step Deskew and Channel Deskew of the two channels 20.

In block S16, the measurement module 105 measures a first resistance value of one of the two channels 20, and simultaneously, measures a second resistance value of the other one of the two channels 20.

In block S17, the comparison module 106 determines if a difference between the first resistance value and the second resistance value is within a first predetermined tolerance by comparison. Block S18 is implemented if the difference between the first resistance value and the second resistance value is beyond the first predetermined tolerance. Otherwise, block S19 is implemented if the difference between the first resistance value and the second resistance value is within the first predetermined tolerance.

In block S18, the parameter setting module 107 adjusts the value of the parameter Step Deskew of one of the two channels 20. In one exemplary embodiment, the parameter setting module 107 decreases the value of the parameter Step Deskew of the channel 20 having a lower resistance value, or increases the value of the parameter Step Deskew of the channel 20 having a higher resistance value. Block S16 is repeated after block S18.

In block 519, the prompt module 102 sends a message containing notification of the disconnection of the cables 3 and the corrector 4.

In block S20, the measurement module 105 measures a first time of achieving a resistance value of one of the two channels 20, and measures a second time of achieving the same resistance value of the other one of the two channels 20, after the cables 3 and the corrector 4 have been disconnected.

In block S21, the comparison module 106 determines if a difference between the first time and the second time is within a second predetermined tolerance by comparison. Block S22 is implemented if the difference between the first time and the second time is beyond the second predetermined tolerance. Otherwise, block S23 is implemented if the difference between the first time and the second time is within the second predetermined tolerance.

In block S22, the parameter setting module 107 adjusts the value of the parameter Channel Deskew of one of the two channels 20. In one exemplary embodiment, the parameter setting module 107 decreases the value of the parameter Channel Deskew of the channel 20 that needs more time to achieve the resistance value, or increases the value of the parameter Channel Deskew of the channel 20 that needs less time to achieve the resistance value. Block S20 is repeated after block S22.

In block S23, the display module 108 determines if another channel 20 needs to be corrected. Block S11 is repeated if there is another channel 20 needed to be corrected. Otherwise, block 24 is implemented if there is no channel 20 needed to be corrected.

In block S24, the display module 108 displays the adjusted values of the parameters Step Deskew and Channel Deskew of all the channels 20 through the display unit 13.

Although certain inventive exemplary embodiments of the present disclosure have been specifically described, the present disclosure is not to be construed as being limited thereto. Various changes or modifications may be made to the present disclosure beyond departing from the scope and spirit of the present disclosure.

What is claimed is:

1. A method of correcting time-domain reflectometers (TDR), wherein each TDR has a plurality of channels, the method comprising:
 (a) connecting two channels of a TDR to a corrector using cables;
 (b) causing each of the two channels to transmit pulses;
 (c) zeroing parameters Step Deskew and Channel Deskew of the two channels;
 (d) measuring a first resistance value of one of the two channels, and simultaneously, measuring a second resistance value of the other one of the two channels;
 (e) adjusting the value of the parameter Step Deskew of one of the two channels upon the condition that a difference between the first resistance value and the second resistance value is beyond a first predetermined tolerance;
 (f) repeating steps (d) and (e) until the difference between the first resistance value and the second resistance value is within the first predetermined tolerance;
 (g) sending a message containing notification of the disconnection of the cables and the corrector;
 (h) measuring a first time of achieving a resistance value of one of the two channels, and measuring a second time of achieving the same resistance value, after the cables and the corrector have been disconnected;
 (i) adjusting the value of the parameter Channel Deskew of one of the two channels upon the condition that a difference between the first time and the second time is beyond a second predetermined tolerance;

(j) repeating steps (h) and (i) until the difference between the first time and the second time is within the second predetermined tolerance;

(k) repeating steps from (a) to (j) until none of the TDR channels needs to be corrected; and (l) displaying the adjusted values of the parameters Step Deskew and Channel Deskew of all the channels through a display unit.

2. The method as described in claim 1, before step (a) further comprising:

initializing the TDR, to return parameter settings of the TDR to factory values.

3. The method as described in claim 1, before (b) further comprising:

sending a message upon the condition that a number of the channels of the TDR connected to the corrector is not two.

4. The method as described in claim 1, in step (e):

decreasing the value of the parameter Step Deskew of the channel that has a lower resistance value, or increasing the value of the parameter Step Deskew of the channel that has a higher resistance value.

5. The method as described in claim 1, in step (i):

decreasing the value of the parameter Channel Deskew of the channel that needs more time to achieve the resistance value, or increasing the value of the parameter Channel Deskew of the channel that needs less time to achieve the resistance value.

6. A non-transitory storage medium having stored thereon instructions that, when executed by a processor, cause the processor to perform a method of correcting a time-domain reflectometers (TDR), each of which has a plurality of channels, the method comprising:

(a) connecting two channels of a TDR to a corrector using cables;

(b) causing each of the two channels to transmit pulses;

(c) zeroing parameters Step Deskew and Channel Deskew of the two channels;

(d) measuring a first resistance value of one of the two channels, and simultaneously, measuring a second resistance value of the other one of the two channels;

(e) adjusting the value of the parameter Step Deskew of one of the two channels upon the condition that a difference between the first resistance value and the second resistance value is beyond a first predetermined tolerance;

(f) repeating steps (d) and (e) until the difference between the first resistance value and the second resistance value is within the first predetermined tolerance;

(g) sending a message containing notification of the disconnection of the cables and the corrector;

(h) measuring a first time of achieving a resistance value of one of the two channels, and measuring a second time of achieving the same resistance value, after the cables and the corrector have been disconnected;

(i) adjusting the value of the parameter Channel Deskew of one of the two channels upon the condition that a difference between the first time and the second time is beyond a second predetermined tolerance;

(j) repeating steps (h) and (i) until the difference between the first time and the second time is within the second predetermined tolerance;

(k) repeating steps from (a) to (j) until none of the TDR channels needs to be corrected; and (l) displaying the adjusted values of the parameters Step Deskew and Channel Deskew of all the channels through a display unit.

7. The non-transitory storage medium d as described in claim 6, wherein before step (a) the method further comprises:

initializing the TDR, to return parameter settings of the TDR to factory values.

8. The non-transitory storage medium as described in claim 6, wherein before (b) the method further comprises:

sending a message upon the condition that a number of the channels of the TDR connected to the corrector is not two.

9. The non-transitory storage medium as described in claim 6, in step (e) of the method:

decreasing the value of the parameter Step Deskew of the channel that has a lower resistance value, or increasing the value of the parameter Step Deskew of the channel that has a higher resistance value.

10. The non-transitory storage medium as described in claim 6, in step (i) of the method:

decreasing the value of the parameter Channel Deskew of the channel that needs more time to achieve the resistance value, or increasing the value of the parameter Channel Deskew of the channel that needs less time to achieve the resistance value.

11. An electronic device, the electronic device being connected with a time-domain reflectometer (TDR), the TDR having a plurality of channels, the electronic device comprising:

at least one processor;

storage unit;

a display unit;

one or more programs that are stored in the storage unit and are executed by the at least one processor, the one or more programs comprising:

a channel enablement module to enable two channels, which are connected to a corrector by cables, of the TDR to transmit pulses;

a parameter setting module to zero parameters Step Deskew and Channel Deskew of the two channels;

a measurement module to measure a first resistance value of one of the two channels, and simultaneously, measure a second resistance value of the other one of the two channels, during the two channels are connected to the corrector by the cables, and further to measure a first time of achieving a resistance value of one of the two channels, and measure a second time of achieving the same resistance value of the other one of the two channels, after the cables and the corrector have been disconnected;

a comparison module to compare a difference between the first resistance value and the second resistance value with a first predetermined tolerance, and to compare a difference between the first time and the second time with a second predetermined tolerance;

a parameter setting module to adjust the value of the parameter Step Deskew of one of the two channels, upon the condition that the difference between the first resistance value and the second resistance value is beyond the first predetermined tolerance, and to adjust the values of the parameter Channel Deskew of one of the two channels upon the condition the difference between the first time and the second time is beyond the second predetermined tolerance; and a display module to display the adjusted values of the parameters Step Deskew and Channel Deskew of all the channels through the display unit, after all the channels have been corrected.

12. The electronic device as described in claim 11, further comprises:
 an initialization module to initialize the TDR 2 to return parameter settings of the TDR to factory values.

13. The electronic device as described in claim 11, further comprising:
 a determination module to determines if a number of the channels connected to the corrector by the cables is two; and
 a prompt module to send a message upon the condition that less than or more than two channels are connected to the corrector by the cables.

14. The electronic device as described in claim 13, wherein the prompt module further to send a message containing notification of the disconnection of the cables and the corrector.

15. The electronic device as described in claim 11, wherein the parameter setting module decreases the value of the parameter Step Deskew of the channel that has a lower resistance value, or increases the value of the parameter Step Deskew of the channel that has a higher resistance value.

16. The electronic device as described in claim 11, wherein the parameter setting module decreases the value of the parameter Channel Deskew of the channel that needs more time to achieve the resistance value, or increases the value of the parameter Channel Deskew of the channel that needs less time to achieve the resistance value.

* * * * *